United States Patent [19]

Felix et al.

[11] 4,361,783

[45] Nov. 30, 1982

[54] TARGET FOR PICTURE TUBE, TUBE PROVIDED WITH SUCH A TARGET AND PICTURE APPARATUS INCORPORATING SUCH A TUBE

[75] Inventors: Pierre Felix; Lucien Guyot, both of Paris, France

[73] Assignee: Thomson-CSF, Paris, France

[21] Appl. No.: 154,112

[22] Filed: May 28, 1980

[30] Foreign Application Priority Data

May 29, 1979 [FR] France ............................... 79 13631

[51] Int. Cl.³ ............................................ H03K 17/88

[52] U.S. Cl. ....................................... 315/374; 358/41

[58] Field of Search ..................... 358/44, 45, 48, 213, 358/41; 315/12 ND, 374; 313/384, 388; 250/334, 370, 333

[56] References Cited

U.S. PATENT DOCUMENTS 3,889,117 6/1975 Shaw, Jr. ........................... 250/334

4,059,840 11/1977 Van De Polder et al. ........... 358/48

4,117,515 9/1978 Carasso et al. ........................ 358/48

4,139,444 2/1979 Singer et al. ........................ 313/388

*Primary Examiner*—Theodore M. Blum

*Attorney, Agent, or Firm*—Roland Plottel

[57] ABSTRACT

The invention relates to a shooting target.

The signal plate covering one of the faces of the actual target is subdivided into a plurality of electrically independent elementary signal plates in order to reduce the stray capacitance during the sampling of the signal on said plate. According to a preferred arrangement, these elementary plates are oriented in the same way as the scanning lines by the reading electron beam. This reading is performed either by a single beam or by a certain number of independent beams each covering a portion of the target.

The applications are the same as in the prior art and in particular to infrared photography.

7 Claims, 5 Drawing Figures

TARGET FOR PICTURE TUBE, TUBE PROVIDED WITH SUCH A TARGET AND PICTURE APPARATUS INCORPORATING SUCH A TUBE

BACKGROUND OF THE INVENTION

The present invention relates to a target, as well as to the picture tube equipped with such a target and the complete apparatus formed by the tube and its reading means.

The target according to the invention can be constructed in different ways, e.g. a photoconductive target made from one of the conventional materials such as antimony sulphide ($Sb_2S_3$), lead oxide (PbO), etc., a photodiode mosaic target formed in a silicon substrate, a pryoelectric target, etc. The invention is applicable in general terms to all types of targets used in picture tubes.

On one of its faces, the target has a conductive plate or signal plate on which is sampled the electrical signal corresponding to the different points on the target, during the point by point scanning of the other face thereof, by the reading electron beam. At each point, the beam deposits a certain quantity of electrons to compensate the effect produced at this point in the target by incident radiation. This quantity, read in the signal plate circuit, constitutes the signal of the point.

One of the problems encountered in connection with such targets is that of the noise inherent in such systems, which has numerous causes, including the actual target. Furthermore, one of the causes of this noise is the capacitance between the signal plate and the system earth or ground.

BRIEF SUMMARY OF THE INVENTION

The present invention relates to a target having a reduced signal plate capacitance.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
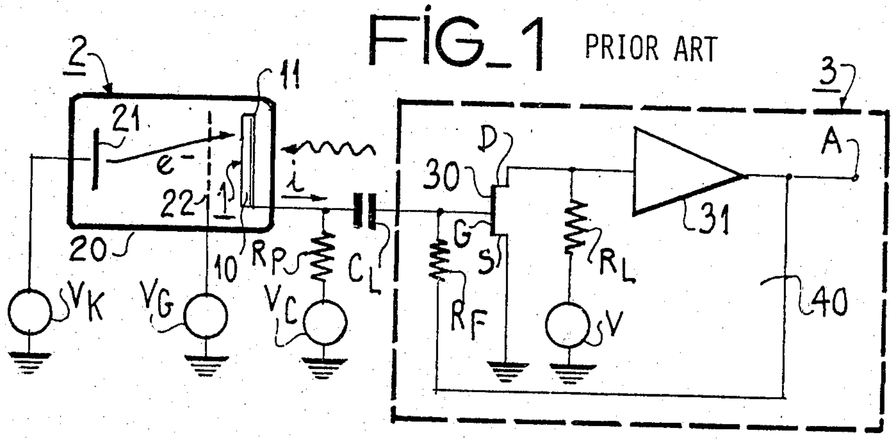
FIG 1 PRIOR ART
FIG. 1 is a diagrammatic view of a prior art image apparatus.

Hereinafter is provided a general description of the prior art image apparatus shown diagrammatically in FIG. 1. FIG. 1 shows the target 1 and its two constituent parts, namely the actual target 10 comprising a plate made from photosensitive material and the signal plate 11 applied to one of the faces thereof. As has been stated hereinbefore, in operation the signals of the different points of the target are sampled from the signal plate. The incident radiation arise from the right of the drawing in the signal plate side, the latter having a good transparency to said radiation indicated by the wavy arrow.

The drawing also shows the pickup tubes, designated overall by the reference numeral 2 and whose vacuum envelope is 20. Within the latter, in operation, cathode 21 supplies an electron beam $e^{-0}$ (bent arrow) directed at the target and, as is known in the art, scans the target in punctiform manner. As they are known in the art, the means used for deflecting the beam for scanning purposes are not shown in the drawing. A grid 22 placed in front of the target is connected to the voltage source $V_G$.

Finally, it is possible to see in FIG. 1, the preamplifier 3 from whose output is collected the signal, e.g. the video signal of the target.

In an existing arrangement, which is used for illustrative purposes here, the signal plate is polarized relative to earth by the voltage source $V_G$, or target voltage, by means of a 5MΩ polarization resistance Rp. Preamplifier 3, which has a low input resistance, has two stages and in the present embodiment, the first is constituted by a junction field effect transistor 30 with a low noise level, whose source and drain are designated as S and D respectively, whilst the grid is G. The second stage consists of an operational amplifier 31, whose output A is that of the reading device. Signal plate 11 is connected to the transistor by a junction capacitance $C_L$ of approximately 10 nanofarads. Loop 40 has a resistance $R_f$ of approximately a few ohms. The drain of the field effect transistor 30 is polarized relative to earth by voltage source V and resistance $R_L$.

Figure 2:
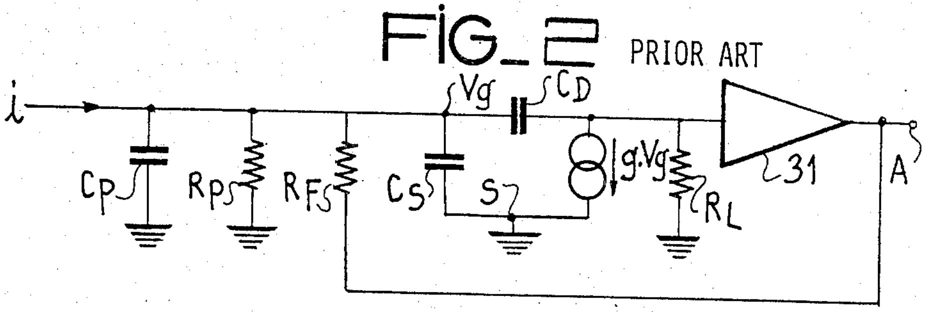
FIG 2 PRIOR ART
FIG. 2 an equivalent circuit diagram relating to the apparatus of FIG. 1.

FIG. 2 is the equivalent circuit diagram of the apparatus of FIG. 1 for the alternating component of the target current i (left-hand arrow) traversing the apparatus. In FIG. 2, $C_p$ represents the stray capacitance of the signal plate (11 in the overall view of FIG. 1) and which in the present case is approximately 8 picofarads, i.e. the capacitance between the signal plate and earth and that of the connections relative to the same earth. Capacitance $C_L$ of FIG. 1 is not shown because, for the alternating component, it is equivalent to a short-circuit. $C_S$ and $C_D$ designate the capacitances of the junction transistor grid relative to the source and the drain thereof and are respectively 2.5 and 1.5 picofarads. Reference g designates the transconductiveness of the junction transistor. $V_G$ represents the alternating component of the voltage level with the transistor grid.

The most important sources of noise in apparatus of this type are the Schottky noise associated with the target current, whereby the lower the target current, the lower the said noise. Another noise source is thermal noise associated with resistances $R_p$ and $R_F$, whereby the higher the resistances, the lower the said noise. Finally, reference is made to the noise associated with the voltage noise $e_n$ of the junction transistor. The noise associated with the target, i.e. generation and recombination noise in the case of a semiconductor target and thermal noise in the case of a pyroelectric target is generally negligible compared with the other sources of noise. The noise current associated with the first stage is also negligible in the case of a junction field effect transistor.

However, it can be shown that overall the noise of such an apparatus is equivalent to a target noise current designated by $i_B$ and of expression:

$$i_B = \frac{2\pi}{\sqrt{3}} e_n C_T B^{\frac{3}{2}} \quad (1)$$

in which $C_T$ is equal to the sum of the stray capacitances and in which $e_n$ designates the noise voltage of the first stage, i.e. of the field effect transistor in the present embodiment. Thus, we obtain $C_T=C_p+C_S+C_D$. In this formula, B designates the pass band of the apparatus, which is proportional to the image or vision frequency and to the number of points of the target, i.e. to the resolution. The current $i_B$ is a few hundred picoamperes.

It is possible to see in expression (1) that the target noise $i_B$ is directly proportional to the total capacitance $C_T$. Thus, for a first given stage, i.e. with predetermined $e_n$, $C_S$ and $C_D$ and predetermined pass band B, the lower the stray capacitance $C_p$ the lower the noise.

According to the invention, the reduction of capacitance $C_p$ is obtained by subdividing the signal plate into a plurality of electrically insulated portions under the conditions described hereinafter.

Hereinbefore, for illustrative purposes, reference has been made to a first stage of the preamplifier constituted by a junction field effect transistor. However, the above conclusions remain valid in general terms for any apparatus using a target, whose signal is sampled from a signal plate, no matter what the construction of the preamplifier stage to which it is connected. All things being equal, the target noise decreases with the signal plate capacitance.

Figure 3:
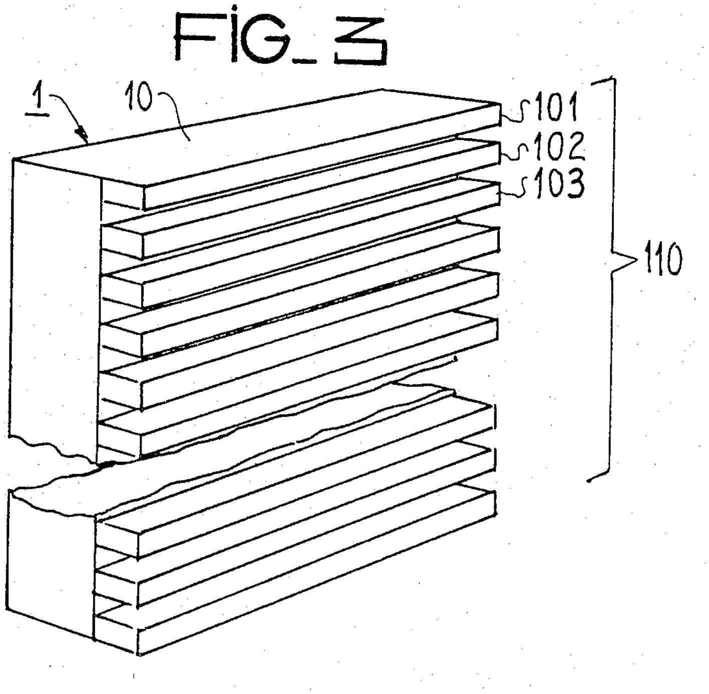
FIG. 3 a perspective view of a target according to the invention.

FIG. 3 is a perspective view of a target according to the invention, designated overall by the reference numeral 1. As in FIG. 1, it comprises the actual target 10 and the signal plate. In FIG. 3, the signal plate has numerals 110. It differs from the plate of FIG. 1 in that it is constituted by a plurality of separate electrically insulated portions, 101, 102, 103, etc. For reasons of clarity, the proportions of these portions and in particular their thicknesses are not shown to scale.

The different portions of the target signal plate or elementary plates can have a random orientation with respect to the scanning direction of the target by the reading beam. However, according to a preferred embodiment they are arranged parallel to the scanning direction.

Thus, the signal plate is subdivided into a plurality of p elementary plates in which p is equal to n/N, N being the number of scanning lines, e.g. television lines and n is the number of lines of this scan facing the elementary signal plate in question. Capacitance $C_p$ is divided by p. Obviously, the maximum value of p is N, i.e. the number of scanning lines. In this case, there are the same number of elementary plates as there are scanning lines.

Each of the elementary signal plates is connected to a preamplifier. A switching system makes it possible to switch at any time the output of the reading device to preamplifiers associated with the elementary signal plates which receive the reading beam, in accordance with known addressing methods. As appropriate, the p preamplifiers and the address register can be positioned externally or internally of the pickup tube, which has the corresponding number of outputs.

Figure 4:
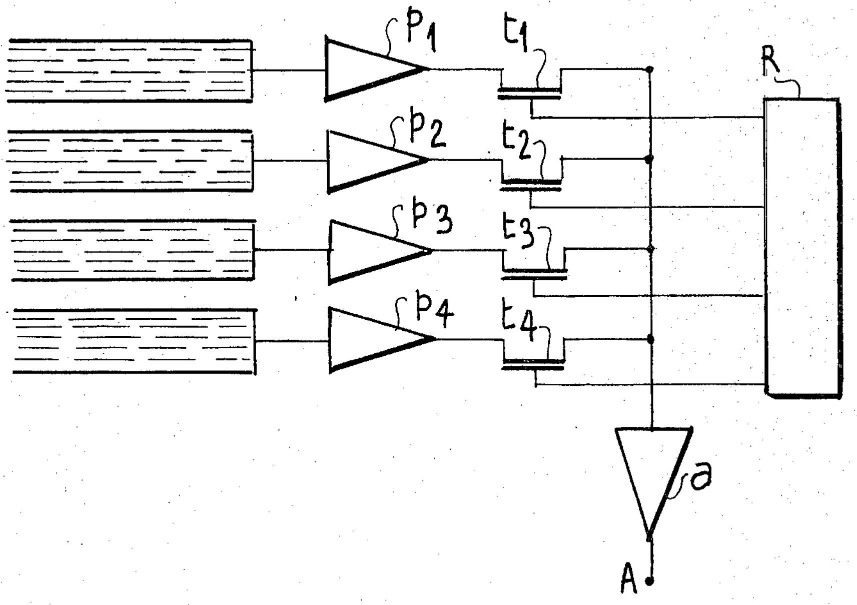
FIGS. 4 and 5 diagram showing two of the switching systems used in the image apparatus according to the invention.

The diagram of such a switching system is given in FIG. 4.

The four elementary signal plates are designated by rectangles, carrying no reference numerals or letters. In the present case, each covers the surface of five scanning lines on the target (broken lines). The p preamplifiers, limited to four in the embodiment, $p_1$, $p_2$, $p_3$, $p_4$ are sequentially connected to the output A of output amplifier a by switching transistors $t_1$, $t_2$, $t_3$, $t_4$. The sequential addressing of the transistor grids is permitted by an address register R, whose scanning is synchronous with the target scanning by the reading beam.

The targets according to the invention and their reading apparatus can be constructed in various ways. These can be classified into two categories, i.e. hybrid or total integration, whereby in the latter the preamplifiers are integrated on the same substrate as the target. However, according to the present state of the art of integrated circuits, it is difficult to obtain very low noise levels. The lowest noise voltage of an integrated operational amplifier is, in nanovolts, $4.\sqrt{B}$, B being the pass band measured in hertz. For this reason, preferance is given to the hybrid construction for the targets according to the invention. In this, the preamplifiers are in the form of separate chips stuck to a common substrate, which can be the window of the pickup tube, i.e. that part of its envelope exposed to incident radiation and in FIG. 1 the right-hand terminal face of said envelope.

It is also possible to read the target according to the invention in which the signal plate is subdivided into a plurality of elementary signal plates by means of a plurality of reading beams, each of them being used for reading the lines facing a plate or a group of elementary plates. k is the number of elementary plates in a group and is a submultiple of p, with a maximum of p, which corresponds to the case of a single reading beam as envisaged hereinbefore. Its minimum is equal to 1, which corresponds to one analysis beam per elementary plate. In the intermediate situation, there are p/k analysis beams. Each of the p/k analysis reading beams analyses in parallel the k elementary signal plates of the group.

In this case for reading purposes, a switching device is used making it possible to sequentially connect the k preamplifiers associated with each of the k plates of the group to each of the p/k outputs of the group.

The p/k electron beams which are necessary, are obtained either from a single cathode and an electron optics making it possible to divide the emitted beam into p/k elementary beams or a system of diaphragms located in the immediate vicinity of the cathode, or on the basis of p/k elementary cathodes. Optionally, the focusing and horizontal and vertical deflecting means are common to all the elementary beams.

Figure 5:
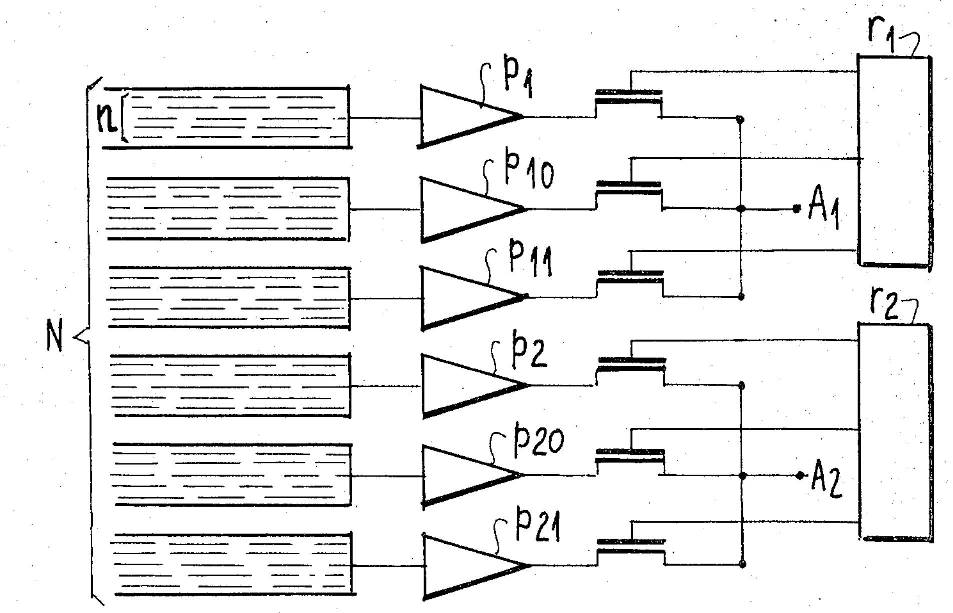

FIG. 5 shows the switching diagram in this case. The elementary signal plates are in this case represented by six rectangles starting from the left of the drawing and covering the space of n scanning lines, with in all N, whereby in this embodiment n=5 and N=30. The same reading beam is used for a group of three elementary signal plates, giving k=3. The preamplifiers are designated $p_1$, $p_{10}$, $p_{11}$ and $p_2$, $p_{20}$, $p_{21}$. The drawing only shows two of these groups, to which correspond the two address registers $r_1$ and $r_2$ and the two outputs $A_1$ and $A_2$, each corresponding to a group of three transistors, installed as in the embodiment of FIG. 4 and without reference numerals.

The advantage of using a plurality of analysis beams can be gathered from the following. In a first type of utilization, the scanning speed for the p/k elementary beam is made the same as the scanning speed in the case of a single beam (unchanged pass band). The scanning period is then $T'=T/(p/k)$ in which T is the scanning period in the case of a single beam, T' representing the duration separating two successive analyses of the same points. This reduction of the field period in a ratio of p/k is favourable, more particularly to the reading of a pyroelectric target in which the spatial resolution is limited by the lateral diffusion of heat within the pyroelectric material. The diffusion length is proportional to the square root of the integration time, which generally coincides with the period T'.

This reduction is also favourable for the reading of a mosaic target of photovoltaic detectors or MIS, sensitive to infrared radiation and where the integration time is limited by the generation due to the continuous background.

However, in another type of utilization, the field period T is retained and the scanning speed is then divided by p/k, in the same way as the pass band. The signal is also divided by p/k. However, as the analysis time of a given point is consequently multiplied by p/k, it is possible to have the same reading efficiency of the target points with a beam resistance higher by a factor of p/k, i.e. with a target current which is lower by a factor of p/k, the beam resistance being inversely proportional to the target current. Thus, the Schottky noise associated with the beam current proportional to $\sqrt{i_c B}$ ($i_c$ designating the target current and B the pass band) is divided by p/k, because $i_c$ and B are in each case separately divided by this factor. The noise associated with the preamplifier $2\pi/3\ e_n\ C_T\ B^{3/2}$ is divided by $p/k^{3/2}$ due to the reduction of the pass band, and by a supplementary term due to the reduction of the capacitance $C_T=C_p+C_S+C_D$ caused by the dividing up of the signal plate. Overall, by retaining the field period T and using p/k parallel analysis beams, it is possible to obtain a significant gain of the signal-to-noise ratio.

The applications of the target according to the invention are the same as for the prior art targets, particularly for infrared photography.

What is claimed is:

1. A target for picture tube, comprising a flat substrate and a signal plate which conducts electricity, applied to one of the faces of the substrate, whose other face is scanned in operation in point by point manner along successive parallel lines by an electron beam, which supplies the quantity of charges necessary for compensating the effect produced by incident radiation on the substrate, whereby this quantity of charges read in the circuit of the signal plate constitutes the signal corresponding to the scanned point, wherein the signal plate is subdivided into a plurality of electrically independent elementary signal plates, arranged parallel to the scanning direction, each elementary signal plate being separately connected to a preamplifier, the respective preamplifiers being sequentially connected to the output amplifier.

2. A target according to claim 1, wherein each of the signal plates faces a plurality of scanning lines.

3. A picture tube incorporating within a vacuum envelope means producing the emission of electrons and a target towards which are directed the said electrons, and means which focus the electrons and deflect them in such a way that they produce substantially punctual impacts on one of the target faces moving from one point to another of the target along successive parallel lines, wherein the target is in accordance with claim 1.

4. A picture tube according to claim 3, wherein the electrons are emitted as a singlebeam successively scanning all the points of the target.

5. A picture tube according to claim 3, wherein the electrons are emitted as a plurality of beams each successively scanning all the points of the target facing a group of elementary signal plates.

6. A picture apparatus comprising a pickup tube incorporating a target and means for scanning one of the faces of said target in punctual manner by an electron beam produced in the tube and depositing electrons at each of its points and a device for reading the charges circulating in the circuit of the signal plate covering the opposite face of said target, wherein the pickup tube is in accordance with claim 4 and wherein the reading device comprises one preamplifier per elementary signal plate and a switching system sequentially ensures the switching of each preamplifier to the single output of the device.

7. A picture apparatus comprising a pickup tube incorporating a target and means for scanning one of the faces of said target in punctual manner by means of an electron beam produced in the tube and depositing electrons at each of these points and a device for reading the charges circulating in the circuit of the signal plate covering the opposite face of said target, wherein the pickup tube is in accordance with claim 5 and wherein the reading device comprises one preamplifier per elementary signal plate and the same number of switching systems as there are groups of elementary signal plates, each system sequentially ensuring the switching of each preamplifier to an output of the device common to the elementary plates of the same group.

* * * * *